US010879192B1

(12) United States Patent
Kuan et al.

(10) Patent No.: US 10,879,192 B1
(45) Date of Patent: Dec. 29, 2020

(54) SEMICONDUCTOR STRUCTURE AND MANUFACTURING METHOD THEREOF

(71) Applicant: Taiwan Semiconductor Manufacturing Co., Ltd., Hsinchu (TW)

(72) Inventors: Hsaing-Pin Kuan, Hsinchu (TW); Ching-Hua Hsieh, Hsinchu (TW); Chih-Wei Lin, Hsinchu County (TW); Chun-Cheng Lin, New Taipei (TW); Yu-Wei Lin, New Taipei (TW); Chun-Yen Lan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/514,987

(22) Filed: Jul. 17, 2019

(51) Int. Cl.
| | |
|---|---|
| *H01L 23/552* | (2006.01) |
| *H01L 23/28* | (2006.01) |
| *H01L 21/768* | (2006.01) |
| *H01L 21/56* | (2006.01) |
| *H01L 23/538* | (2006.01) |

(52) U.S. Cl.
CPC ............ *H01L 23/552* (2013.01); *H01L 21/56* (2013.01); *H01L 21/768* (2013.01); *H01L 23/28* (2013.01); *H01L 23/5385* (2013.01)

(58) Field of Classification Search
CPC .................................................. H01L 23/552
See application file for complete search history.

(56) References Cited

U.S. PATENT DOCUMENTS

| | | | | |
|---|---|---|---|---|
| 6,720,649 B2* | 4/2004 | Huang | ............... | H01L 23/3128 257/706 |
| 7,161,252 B2* | 1/2007 | Tsuneoka | ............ | H01L 23/3121 257/100 |
| 7,687,895 B2* | 3/2010 | Brunnbauer | ......... | H01L 21/561 257/685 |
| 8,008,769 B2* | 8/2011 | Tseng | .................... | H01L 21/565 257/718 |
| 8,268,677 B1* | 9/2012 | Pagaila | ............ | H01L 23/49838 438/127 |
| 8,993,380 B2 | 3/2015 | Hou et al. | | |
| 9,137,934 B2* | 9/2015 | Morris | ................ | H05K 1/0218 |

(Continued)

*Primary Examiner* — David A Zarneke
(74) *Attorney, Agent, or Firm* — JCIPRNET

(57) ABSTRACT

A semiconductor structure and a manufacturing method thereof are provided. A semiconductor structure includes a first semiconductor die, an insulating encapsulation laterally encapsulating the first semiconductor die, an electromagnetic shielding structure enclosing the first semiconductor die and a first portion of the insulating encapsulation, and a redistribution structure. The electromagnetic shielding structure includes a first conductive layer and a dielectric frame laterally covering the first conductive layer. The first conductive layer surrounds the first portion of the insulating encapsulation and extends to cover a first side of the first semiconductor die. The dielectric frame includes a first surface substantially leveled with the first conductive layer. The redistribution structure is disposed on a second side of the first semiconductor die opposing to the first side, and the redistribution structure is electrically coupled to the first semiconductor die and the first conductive layer of the electromagnetic shielding structure.

13 Claims, 11 Drawing Sheets

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,953,932 B2 * | 4/2018 | Kawabata ............... H01L 24/97 |
| 10,134,683 B2 * | 11/2018 | Chen ....................... H01L 24/19 |
| 10,217,711 B2 * | 2/2019 | Yoon ..................... H01L 21/561 |
| 10,559,513 B2 * | 2/2020 | Lin ..................... H01L 23/4334 |
| 10,629,519 B2 * | 4/2020 | Chen ................... H01L 21/6835 |
| 2006/0163707 A1 * | 7/2006 | Hooi ...................... H05K 3/301 |
| | | 257/678 |
| 2007/0090533 A1 * | 4/2007 | Haga ....................... H01L 24/73 |
| | | 257/777 |
| 2009/0184404 A1 * | 7/2009 | Jow ..................... H01L 23/3121 |
| | | 257/659 |
| 2012/0228749 A1 * | 9/2012 | Pagaila ................. H01L 23/147 |
| | | 257/659 |
| 2017/0243832 A1 * | 8/2017 | Hong ............... H01L 21/32051 |
| 2019/0057929 A1 * | 2/2019 | Chen ....................... H01L 21/56 |
| 2019/0164902 A1 * | 5/2019 | Xiao ................... H01L 23/3135 |
| 2019/0237407 A1 * | 8/2019 | Lee ..................... H01L 23/3128 |
| 2019/0267301 A1 * | 8/2019 | Yazaki ................. H05K 9/0075 |
| 2019/0341352 A1 * | 11/2019 | We ......................... H01L 21/78 |
| 2019/0378803 A1 * | 12/2019 | Chang Chien ........ H01L 23/552 |
| 2020/0203313 A1 * | 6/2020 | Chen ................... H01L 23/3736 |

\* cited by examiner

US 10,879,192 B1

SEMICONDUCTOR STRUCTURE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, these improvements in integration density have come from repeated reductions in minimum feature size, which allows more components to be integrated into a given area. Technological advances in integrated circuit (IC) design have produced generations of ICs where each generation has smaller and more complex circuit designs than the previous generation. For example, various types and dimensions of semiconductor structures performing different functionalities are integrated and packaged into an integrated fan-out package, and numerous manufacturing operations are implemented for integration of various types of semiconductor packages. In the currently fabricated integrated fan-out packages, an electromagnetic interference (EMI) shielding structure may be used to shield the semiconductor components which require isolation from external EMI. However, there are more challenges to modify a semiconductor package and improve the manufacturing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
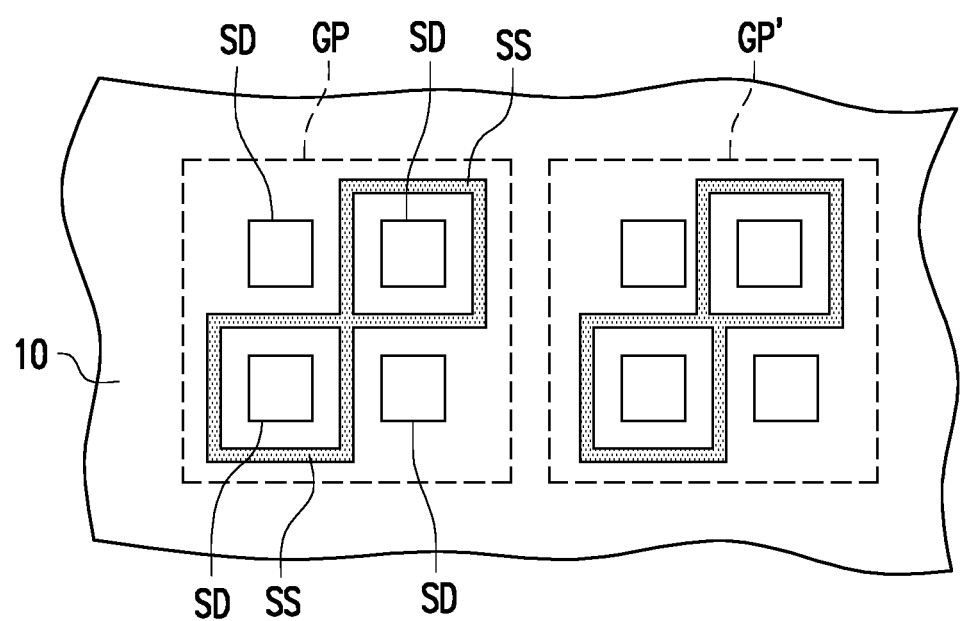
FIG. 1 is a schematic top plan view illustrating a configuration of semiconductor dies and electromagnetic shielding structures in an intermediate state of formation of a semiconductor structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic top plan view illustrating a configuration of semiconductor dies and electromagnetic shielding structures in an intermediate state of formation of a semiconductor structure, in accordance with some exemplary embodiments of the disclosure. Referring to FIG. 1, a plurality of semiconductor dies SD and electromagnetic shielding structures SS are illustrated. It should be noted that the semiconductor dies SD and electromagnetic shielding structures SS may be fabricated from a variety of materials such as metals (copper, aluminum, gold, etc.) and polymers (polyimide, PBO, epoxy, etc.), various features of the semiconductor dies SD and the electromagnetic shielding structures SS are omitted from FIG. 1 for the sake of clarity, and the details thereof will be description later in other embodiments. The various semiconductor dies SD performing the same or different functions are separately disposed on a temporary carrier 10. In some embodiments, the electromagnetic shielding structures SS may include a plurality of discrete elements. For example, the discrete elements may be formed as frames or rings for encircling the semiconductor dies SD therein. For example, the electromagnetic shielding structures SS define a plurality of compartments, and one or more than one semiconductor dies SD may be disposed within one of the compartments.

In some embodiments, the electromagnetic shielding structures SS include the shape of a square, a rectangular, a circle, an oval, a polygon, a zig-zag, or other irregular shape(s) in a top plan view. The dimension of the electromagnetic shielding structures SS may vary with the size or the number of semiconductor dies SD enclosed therein. The semiconductor dies SD and the electromagnetic shielding structures SS may be disposed as a plurality of groups (e.g., GP and GP') on a temporary carrier 10. In some embodiments, after formation, the semiconductor dies SD and the electromagnetic shielding structure SS in each group (e.g., GP or GP') may be packaged to form a system in package (SiP). The structures in some groups GP/GP' may be identical to one another for ease of fabrication. It should be appreciated that the configuration shown in FIG. 1 merely serves as an illustrative example. It should also be noted that the electromagnetic shielding structures SS may be formed according to a variety of shapes, sizes, or configurations, and are not limited to the examples illustrated herein. Different arrangements of the group GP/GP' including various sizes of semiconductor dies SD and/or electromagnetic shielding structure SS may be employed depending on the design requirements.

Figure 10:
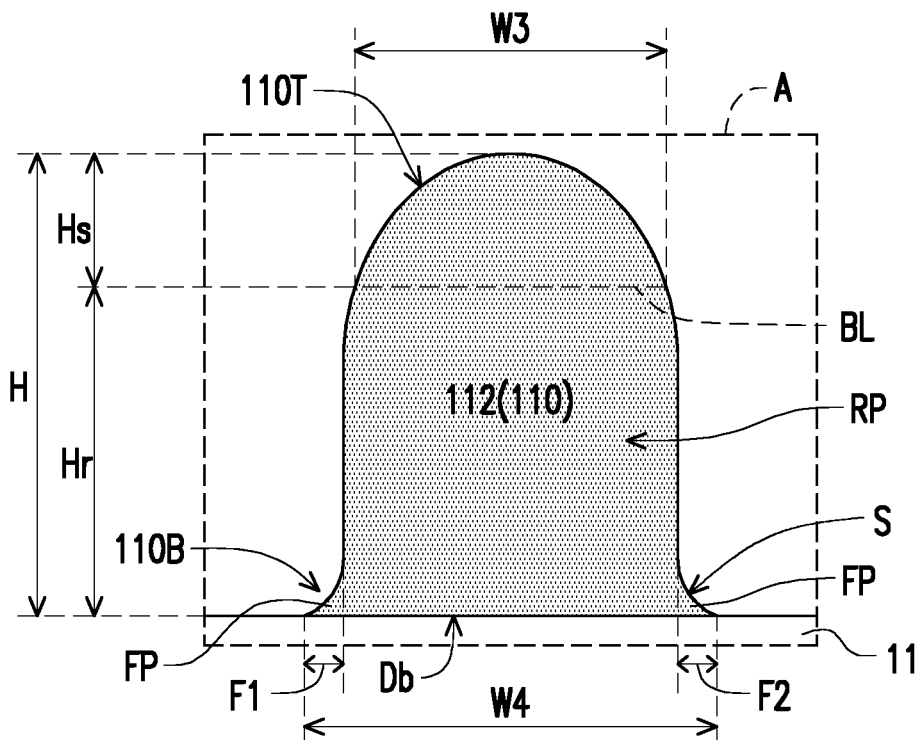
FIG. 10 is a schematic, enlarged cross-sectional view of the dashed area A outlined in FIG. 2B, in accordance with some exemplary embodiments of the disclosure.
Figure 11:
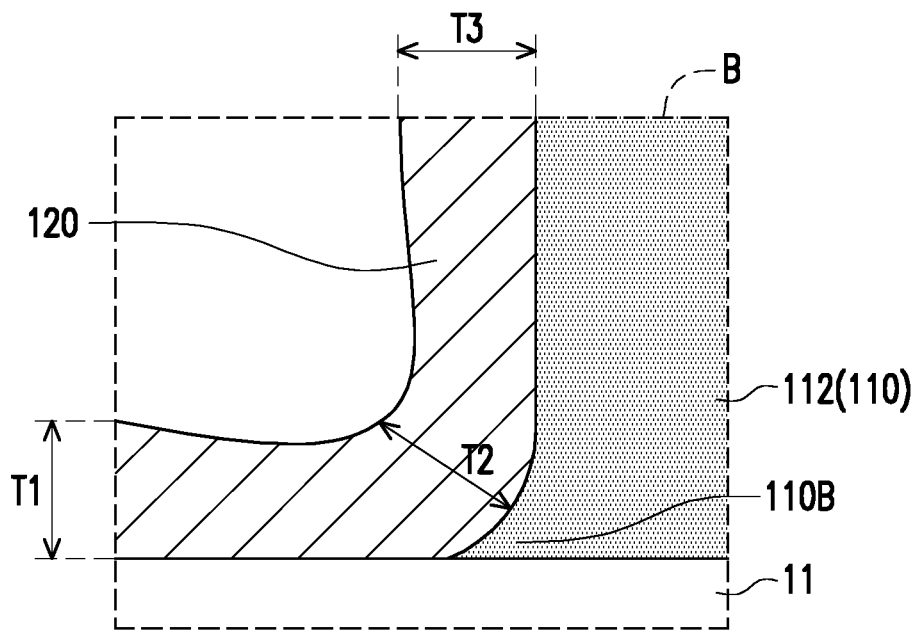
FIG. 11 is a schematic, enlarged cross-sectional view of the dashed area B outlined in FIG. 3B, in accordance with some exemplary embodiments of the disclosure.
Figure 12:
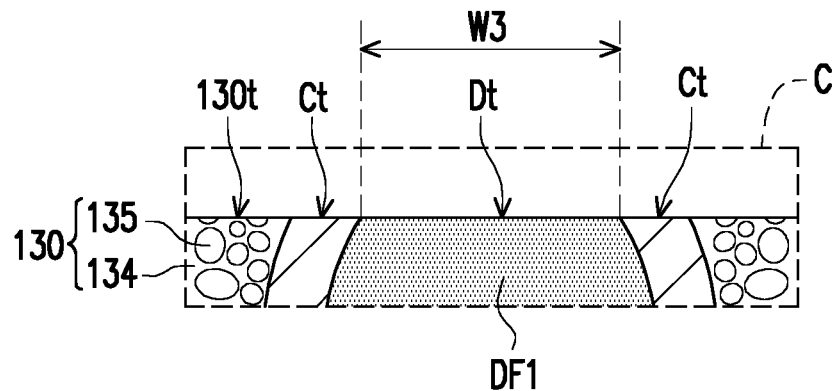
FIG. 12 is a schematic, enlarged cross-sectional view of the dashed area C outlined in FIG. 6B, in accordance with some exemplary embodiments of the disclosure.
Figure 13:
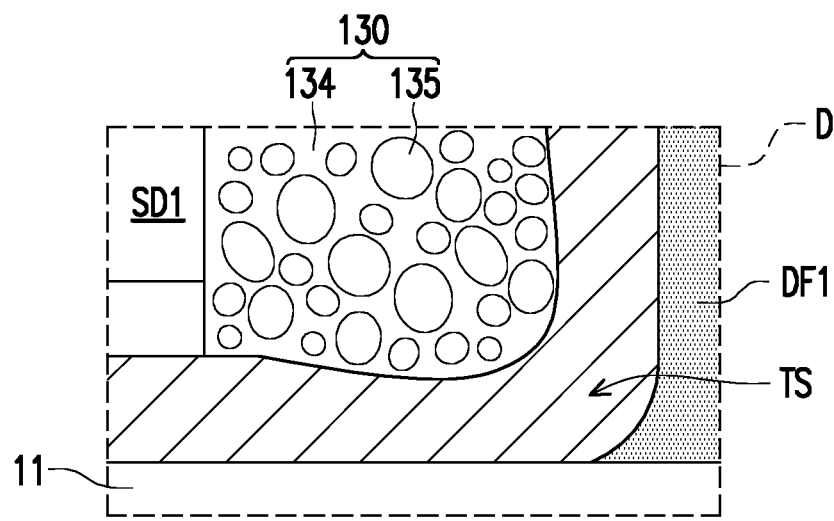
FIG. 13 is a schematic, enlarged cross-sectional view of the dashed area D outlined in FIG. 6B, in accordance with some exemplary embodiments of the disclosure.

FIGS. 2A, 2B, 3A, 3B, 4A, 4B, 5A, 5B, 6A, 6B, 7, 8, and 9 illustrate various stages in the formation of a semiconductor structure, in accordance with some exemplary embodiments of the disclosure. The group GP outlined in FIG. 1 is taken as an illustrative example to show a manufacturing method of a semiconductor structure. In addition, FIGS. 2A, 2B, 3A, 3B, 4A, 4B, 5A, 5B, 6A, and 6B are top plan and cross-sectional views, where figures ending with an "A" designation are top plan views, and figures ending with a "B" designation are cross-sectional views taken along section lines (e.g., a section line 2B-2B in FIG. 2A, a section line 3B-3B in FIG. 3A, a section line 4B-4B in FIG. 4A, a section line 5B-5B in FIG. 5A, and a section line 6B-6B in FIG. 6A) of the corresponding top plan view. FIG. 10 is a schematic, enlarged cross-sectional view of the dashed area A outlined in FIG. 2B, FIG. 11 is a schematic, enlarged cross-sectional view of the dashed area B outlined in FIG. 3B, FIG. 12 is a schematic, enlarged cross-sectional view of the dashed area C outlined in FIG. 6B, and FIG. 13 is a schematic, enlarged cross-sectional view of the dashed area D outlined in FIG. 6B, in accordance with some exemplary embodiments of the disclosure.

Figure 2A:
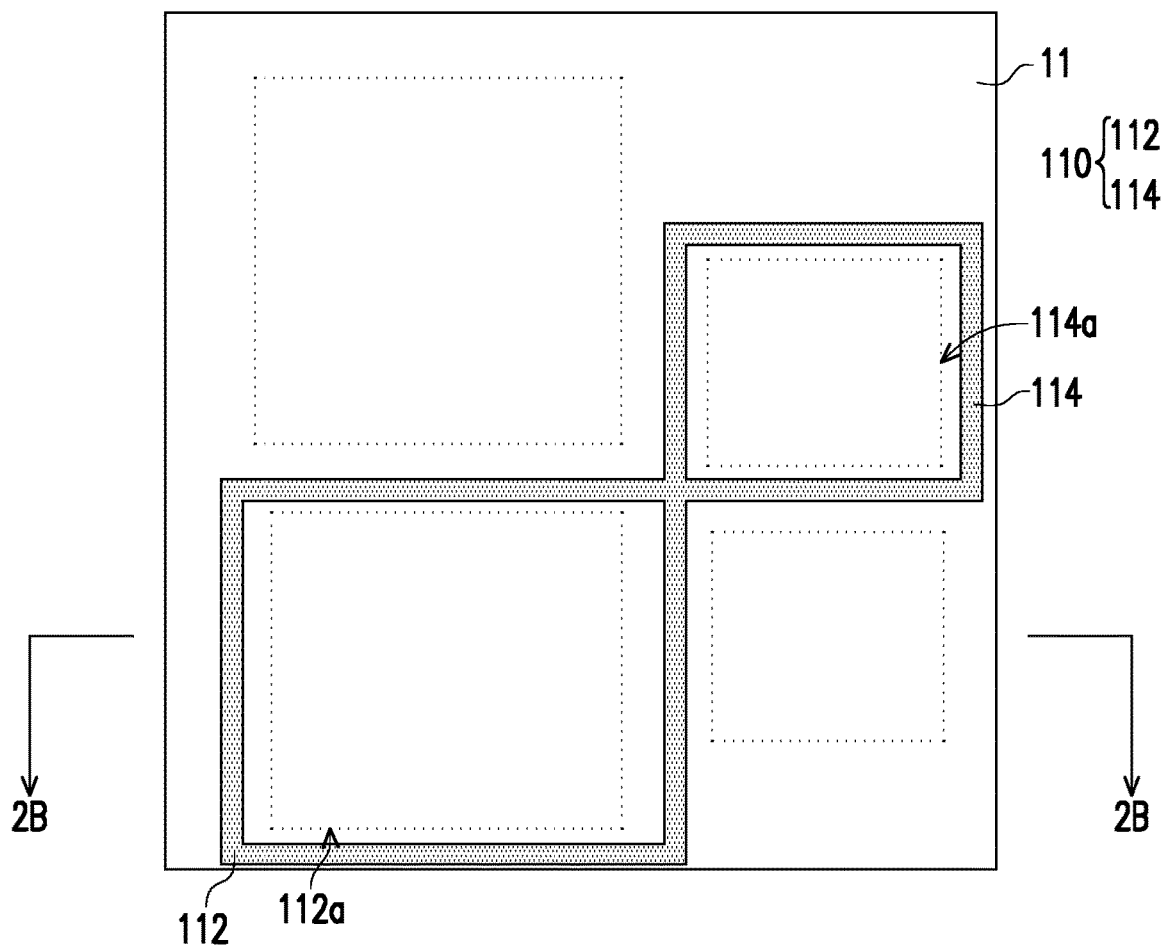
FIGS. 2A, 2B, 3A, 3B, 4A, 4B, 5A, 5B, 6A, 6B, 7, 8, and 9 illustrate various stages in the formation of a semiconductor structure, in accordance with some exemplary embodiments of the disclosure.
Figure 2B:
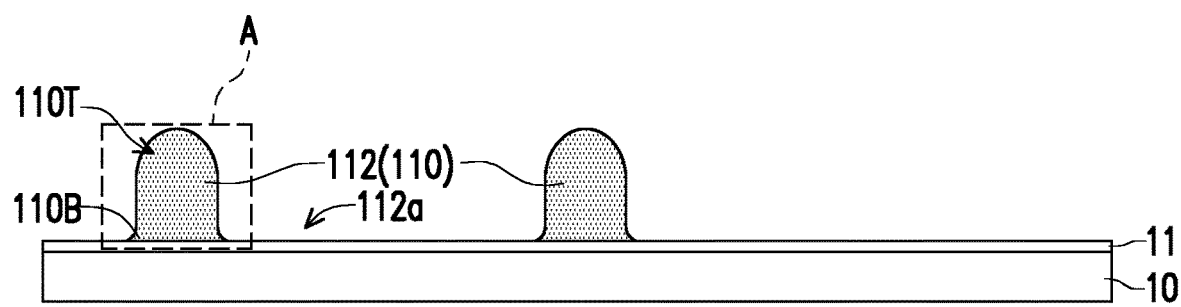

Referring to FIG. 2A, FIG. 2B, and FIG. 10, a dielectric pattern 110 is formed over the temporary carrier 10. The temporary carrier 10 may include a temporary material during processing, such as a glass substrate, a ceramic substrate, a metal carrier, a carrier made of polymer, a silicon wafer, or the like. In some embodiments, a release layer 11 is formed over the temporary carrier 10 to enhance the releasability between the subsequently formed structure and the temporary carrier 10. For example, the release layer 11 includes a layer of light-to-heat-conversion (LTHC) release coating and a layer of associated adhesive. The dielectric pattern 110 may be formed in one or multiple ring shape(s) around the predetermined area(s). In some embodiments, the dielectric pattern 110 may be formed as a wall structure having a closed-loop shape in a top plan view. It will be appreciated that the dielectric pattern 110 may form other shapes and still achieve its purposes. In some embodiments, the dielectric pattern 110 includes more than one wall structures (e.g., a first wall structure 112 and a second wall structure 114). For example, the first wall structure 112 and the second wall structure 114 are integratedly formed. The first wall structure 112 may have at least one edge in contact with one edge of the second wall structure 114. In some embodiments, an outer sidewall of the first wall structure 112 is partially connected to an outer sidewall of the second wall structure 114 (as the illustration of the group GP' in FIG. 1). In other embodiments, the first wall structure 112 and the second wall structure 114 of the dielectric pattern 110 may share at least one sidewall. For example, an entirety of the outer sidewall of the first wall structure 112 is connected to the outer sidewall of the second wall structure 114. The configuration of the dielectric pattern 110 may be adjusted depending on the design requirements, which is not limited thereto.

In some embodiments, the first wall structure 112 and the second wall structure 114 respectively define a first opening area 112a and a second opening area 114a. The first opening area 112a enclosed by the first wall structure 112 and the second opening area 114a enclosed by the second wall structure 114 may be sized to accommodate the subsequently disposed semiconductor dies (e.g., the dashed boxes located within the first opening area 112a and the second opening area 114a as illustrated in FIG. 2A). It should be noted that as shown in FIG. 2A, the dashed boxes located outside the first wall structure 112 and the second wall structure 114 indicate the reserved space for other semiconductor dies.

The dielectric pattern 110 may include a polymeric material, such as an epoxy, a resin, polyimide, polybenzoxazole (PBO), benzocyclobutene (BCB), the like, or a combination thereof. In some embodiments, the dielectric pattern 110 is made of a filler-free polymer. In other embodiments, the material of the dielectric pattern 110 includes a plurality of non-conductive particulate fillers dispersed in the polymeric base material. In some embodiments, the dielectric pattern includes a curable material such as an ultraviolet (UV) cured resin. For example, a dielectric material may be provided in semi-liquid form and may be subsequently cured to harden so as to from the dielectric pattern 110. In some embodiments, the dielectric material may be at intermediate stage between liquid and fully cured polymer, and the dielectric material may be fully cured together with the subsequently formed conductive material. The dielectric pattern 110 may be formed using ink jet printing, spraying, or dispensing, optionally followed by a curing step. The curing process may include a ultra-violet (UV) light exposure process, an infrared (IR) energy exposure process, combinations thereof, or a combination thereof with a heating process. Other suitable processes may be used to form the dielectric pattern 110. Alternatively, the dielectric pattern 110 is preformed and disposed over the temporary carrier 10 using a pick and place process.

In some embodiments, after performing the curing process, the dielectric pattern 110 (e.g., the first wall structure 112 and the second wall structure 114) includes a top 110T and a bottom 110B. The top 110T may have a curve surface such as a hemispherical shape, a semi-ellipsoidal shape, or a reverse U-shaped profile in a cross section. For example, the bottom profile of the dielectric pattern 110 is formed in a shape of an exponential curve in a cross section. In some embodiments, the dielectric pattern 110 has a bell-shaped profile in a cross section as shown in FIG. 10. In other embodiments in which the dielectric pattern 110 is preformed or formed by other techniques, the first wall structure 112 and the second wall structure 114 may have substantially vertical sidewalls without the footing bottom, and the top 110T of the first wall structure 112 and the second wall structure 114 may be rounded or substantially flat.

Continue to FIG. 10, in an exemplary embodiment, the dielectric pattern 110 includes a ratio of a height H to a bottom width W4 of a bottom surface Db (i.e. a first surface) greater than 1 or substantially equal to 1. In some embodiments, a ratio of the height H to the bottom width W4 of the dielectric pattern 110 is less than 1. In some embodiments, the top 110T of the dielectric pattern 110 (e.g., the portion having a hemispherical profile) may be considered sacrificial in the sense that the top 110T is ultimately removed (the process will be described later in FIG. 6A and FIG. 6B). For example, the boundary BL outlined in dashed indicates the borderline of the sacrificial top and the remaining portion RP. In some embodiments, a ratio of a height Hs of the sacrificial top to a height Hr of the remaining portion RP is about 1:2. For example, a ratio of a height Hr of the remaining portion RP to the bottom width W4 is less than 1 (e.g., in a range of about 0.7 to about 1.5) or substantially equal to 1. It should be noted that other ratios are also possible depending on the sizes of the dielectric pattern 110 and the to-be-disposed semiconductor dies. In some embodiments, the remaining portion RP including the bottom 110B has a width W3 opposite to the bottom width W4, and a sloped sidewall S connected to the bottom width W4 and the width W3. The bottom width W4 is greater than the width W3. In some embodiments, the sloped sidewall S slopes from the bottom 110B upwardly towards the boundary BL at an angle less than or substantially equal to 90 degrees, creating a footing profile at the bottom of the dielectric pattern 110. The bottom 110B includes a footing part FP extending outwardly. The footing part FP includes various footing widths (e.g., F1, F2) in a cross section. The maximum footing widths F1 and F2 of the footing part FP may be substantially uniform or may not be uniform in a cross section (e.g., as shown in FIG. 10). In some embodiments, a ratio of the maximum footing width (e.g., F1 plus F2) of the footing portion FP to the total bottom width W4 of the bottom surface Db is about 20% to about 50%. It should be noted that other ratios are also possible depending on the material and the process technology of formation of the dielectric pattern 110.

Figure 3A:
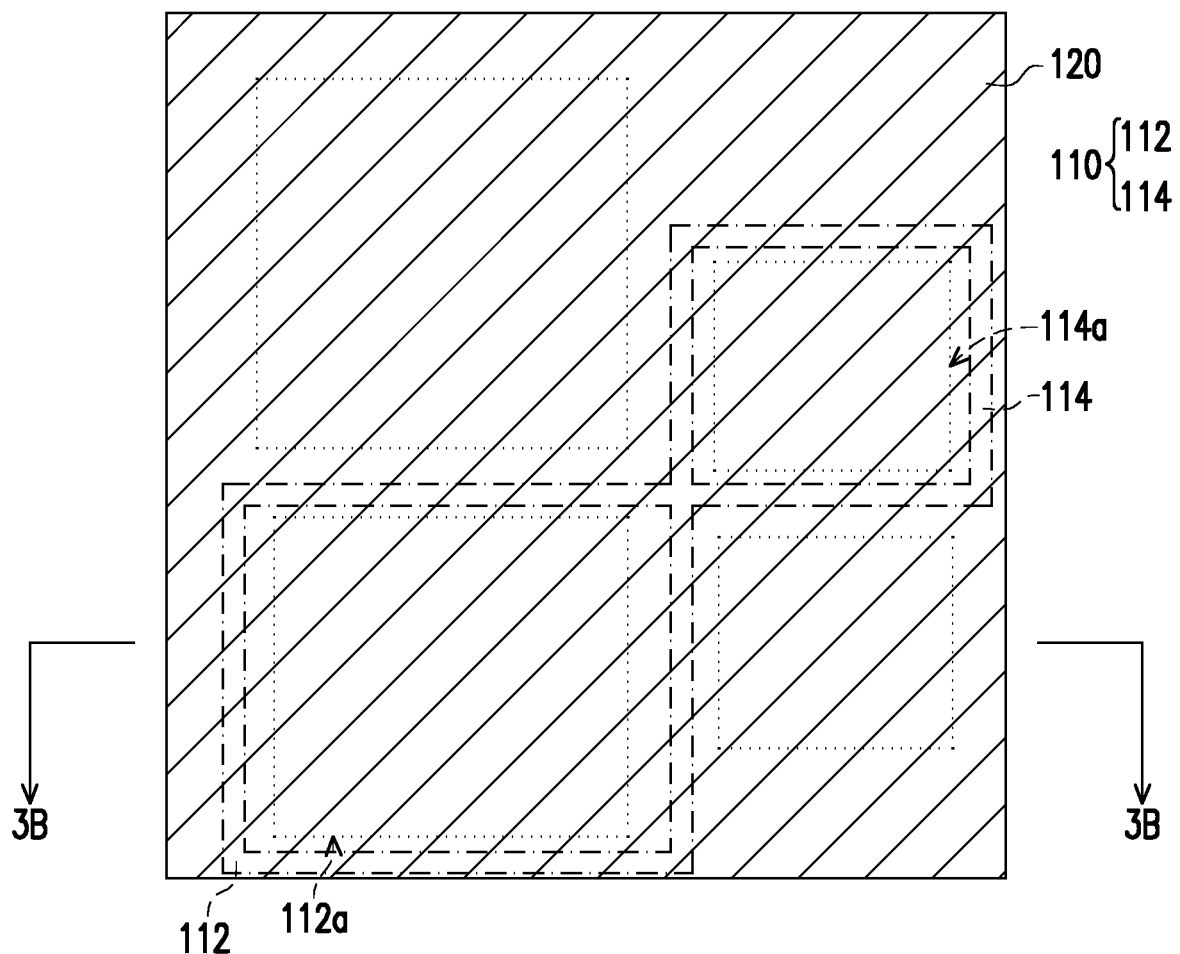
Figure 3B:
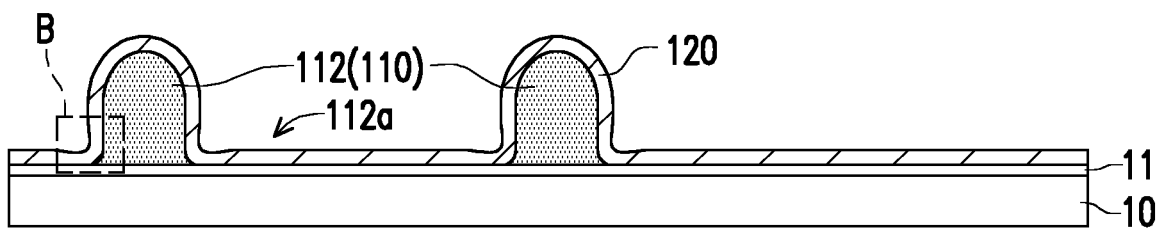

Referring to FIG. 3A, FIG. 3B, and FIG. 11, a conductive material 120 is formed on the dielectric pattern 110. For example, the conductive material 120 is formed along an outer surface of the dielectric pattern 110 and extending within the areas (e.g., the first opening area 112a and the second opening area 114a) enclosed by the dielectric pattern 110. The conductive material 120 may be a conformal blanket layer covering the dielectric pattern 110, the first opening area 112a, the second opening area 114a, and the area outside the dielectric pattern 110. In some embodiments, the conductive material 120 is formed over the temporary carrier 10, following the contour of the first wall structure 112 and the second wall structure 114. It should be noted that as shown in FIG. 3A, the first wall structure 112 and the second wall structure 114 are illustrated by the dot-dash lines to indicate the dielectric pattern 110 is covered by the conductive material 120 at this stage.

For example, the conductive material 120 is formed by spray coating, sputtering, plating, a combination thereof, or other suitable deposition process. In some embodiments, the conductive material 120 includes a conductive paste (e.g., silver paste, copper paste, etc.) and may be sprayed on the dielectric pattern 110 and the release layer 11. Subsequently, the conductive paste is cured to form the conductive material 120. In some embodiments, the dielectric pattern 110 is fully cured when performing the curing process onto the conductive paste. The conductive paste may include an adhesive base material and conductive fillers (e.g., pure metal (e.g., copper, silver, gold, etc.) particles, metal alloy (e.g., copper-silver alloy) particles, or the mixture thereof, etc.) mixed with the adhesive base material. In some embodiments, a seed material including a titanium/copper composite layer (not shown) is sputtered on the dielectric pattern 110 and the release layer 11, and then a copper layer (not shown) is plated on the seed material to form the conductive material 120.

Continue to FIG. 11, in some embodiments, the conductive material 120 has varying thicknesses (e.g., T1, T2, and T3). For example, the thickness of the conductive material 120 may be in a range of about 10 µm to about 20 µm. Other thickness of the conductive material 120 may also be possible depending on the design requirements. It should be appreciated that the illustration of the dielectric pattern 110 and the conductive material 120 are schematic and are not in scale. The conductive material 120 formed on different locations may have different thickness. In some embodiments, the thickness T1 of a portion of the conductive material 120 formed on the release layer 11 is greater than the thickness T2 of a portion of the conductive material 120 formed on the bottom 110B of the dielectric pattern 110. The thickness T2 may correspond to the turning section of the bottom 110B of the conductive material 120. The thickness T3 of a portion of the conductive material 120 formed on the sidewall of the dielectric pattern 110 may be greater than the thickness T2 of the portion of the conductive material 120. The portion of the conductive material 120 formed on the bottom 110B of the dielectric pattern 110 may have a smallest thickness. The thickness T1 may be substantially equal to or slightly greater than the thickness T3. Alternatively, the thickness T3 may be slightly greater than the thickness T1.

Figure 4A:
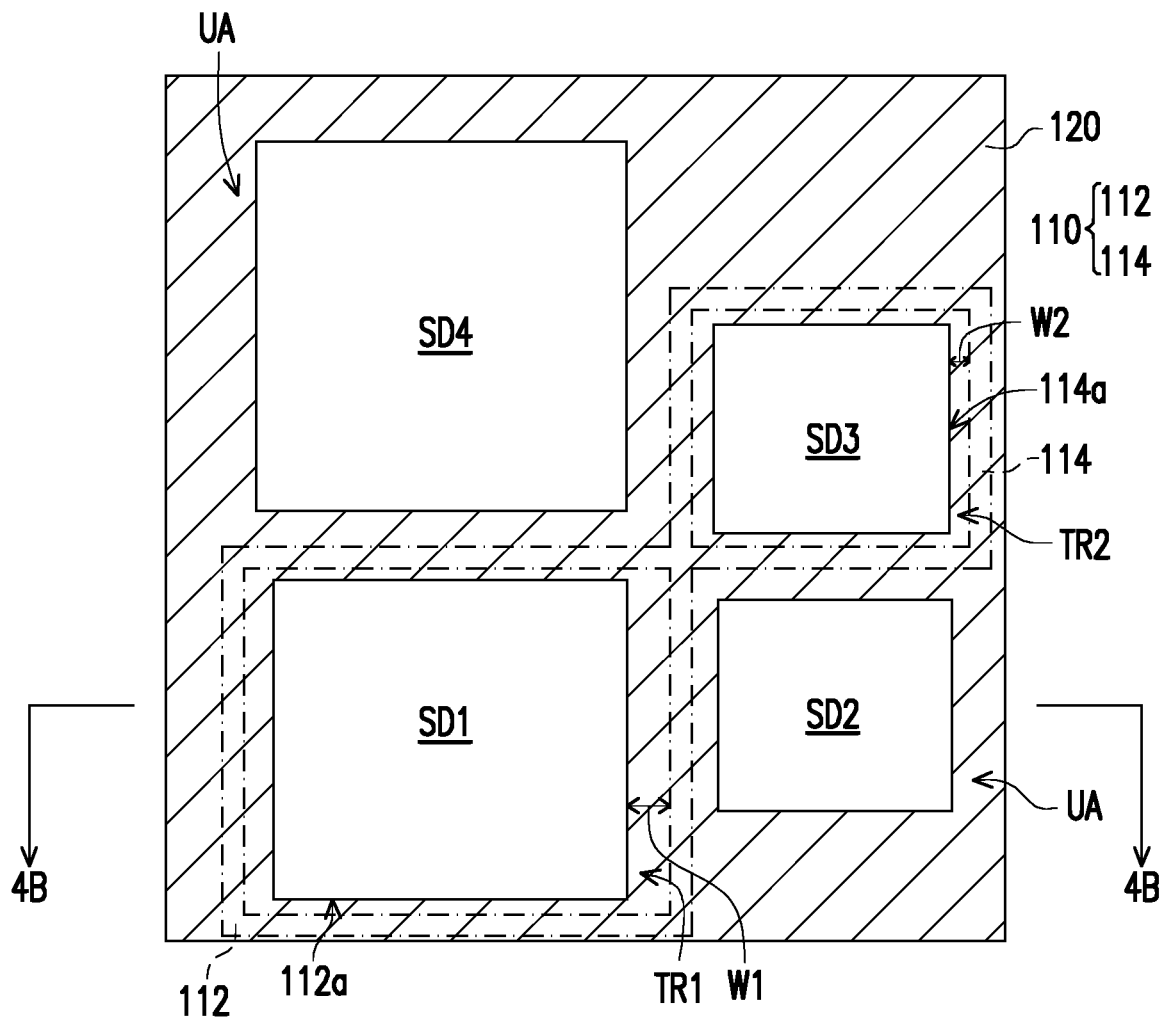
Figure 4B:
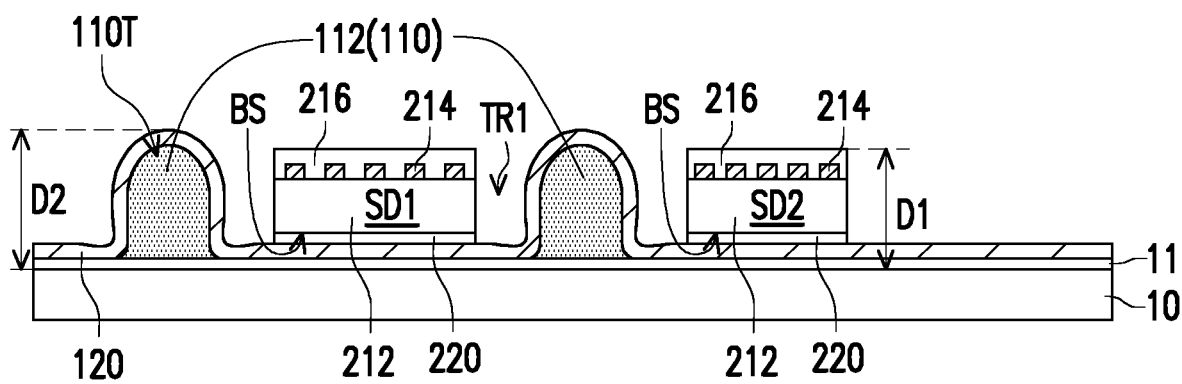

Referring to FIG. 4A and FIG. 4B, a plurality of semiconductor dies (e.g., SD1, SD2, SD3, SD4) are disposed on the conductive material 120, and at least one of the semiconductor dies (e.g., SD1, SD3) may be disposed within the area enclosed by the dielectric pattern 110. Other semiconductor dies (e.g., SD2, SD4) may be disposed in the unconfined area UA (e.g., the region outside the area confined by the dielectric pattern 110). It should be appreciated that although only semiconductor dies SD1 and SD3 are respectively disposed within the first opening area 112a and the second opening area 114a, the first opening area 112a and the second opening area 114a can accommodate more semiconductor dies. In some embodiments, each semiconductor die (e.g., SD1, SD2, SD3, SD4) is provided with a bonding layer 130 attached to a back surface BS of the respective semiconductor die (e.g., SD1, SD2, SD3, SD4). The bonding layer 130 may be or may include a LTHC material, a die attach film (DAF), or the like. For example, the semiconductor dies (e.g., SD1, SD2, SD3, SD4) may be bonded to the conductive material 120 through the bonding layer 130.

Each of the semiconductor dies (e.g., SD1, SD2, SD3, SD4) may include a semiconductor substrate 212, a plurality of conductive contacts 214 disposed on the semiconductor substrate 212, and a protection layer 216 disposed on the semiconductor substrate 212 and covering the conductive contacts 214. The semiconductor substrate 212 may be a silicon substrate including active components (e.g., transistors, or the like) and/or passive components (e.g., resistors, capacitors, inductors, or the like) formed therein. The conductive contacts 214 may include conductive bumps and/or conductive pads. A material of the protection layer 216 may include polyimide (PI), polybenzoxazole (PBO), benzocyclobutene (BCB), combinations thereof, or a dielectric layer formed by other suitable polymers. In some embodiments, the protection layer 216 is thick enough to cover the conductive contacts 214, thereby preventing the conductive contacts 214 from damage during processing. Alternatively, the protection layer 216 is omitted and the conductive contacts 214 are exposed. It should be noted that various layers and features (e.g., an interconnection layer, a passivation layer, a post-passivation layer, etc.) of the semiconductor dies are omitted from the figures.

In some embodiments, the semiconductor dies (e.g., SD1, SD2, SD3, SD4) may be the same type of dies or different types of dies performing various functions. For example, the semiconductor dies (e.g., SD1, SD2, SD3, SD4) may include a radio frequency (RF) integrated circuit die, a baseband (BB) die, a WiFi die, an integrated passive device (IPD), a surface mount device (SMD), an application-specific integrated circuit (ASIC) die, a sensor die, a memory die, a logic die, a digital die, an analog die, a passive component die, a micro-electro mechanical system (MEMS) die, combinations thereof, or other suitable types of die(s). In some embodiments, the semiconductor dies (e.g., SD1, SD2, SD3, SD4) may be referred as a chip or an integrated circuit of combination-type. For example, one of the semiconductor dies (e.g., SD1, SD2, SD3, SD4) may be a WiFi chip simultaneously including both of a RF die and a digital die. It should be noted that different types of the semiconductor dies may have different components formed therein, and the semiconductor dies (e.g., SD1, SD2, SD3, SD4) throughout the drawings are merely intended to be illustrative and are not intended to limit the embodiments. In some embodiments, any types of the semiconductor dies which require isolation from external electromagnetic interference (EMI) may be disposed within the first opening area 112a and/or the second opening area 114a. Since RF dies may be more susceptible to electromagnetic interference than logic dies, in some embodiments, at least one of the semiconductor dies (e.g., SD1, SD3) including RF components may be disposed on the conductive material 120 and within the first opening area 112a and/or the second opening area 114a such that a leakage of RF signals generated by the RF die out of the semiconductor structure may be prevented.

Continue to FIG. 4B, the dielectric pattern 110 is formed with a predetermined thickness (or highness) greater than a thickness of the semiconductor die (e.g., SD1, SD2, SD3, SD4), and after disposing the semiconductor dies SD1, SD2, SD3, SD4, the top of dielectric pattern 110 is higher than the top of semiconductor dies SD1, SD2, SD3, SD4 using the temporary carrier 10 as a reference plane. In some embodiments, the dielectric pattern 110 is about 10% higher than the semiconductor dies SD1, SD2, SD3, SD4. In some embodiments, a shortest distance D1 measured from a top surface of the protection layer 216 of respective semiconductor die (e.g., SD1, SD2, SD3, SD4) to the temporary carrier 10 is less than a shortest distance D2 measured from a top surface of the conductive material 120 covering the rounded top 110B of the dielectric pattern 110 to the temporary carrier 10. For example, the shortest distance D2 may be greater than the shortest distance D1 at least about 20 µm.

In other embodiments, the shortest distance D1 and the shortest distance D2 are substantially equal. It should be noted that the difference of the shortest distances D1 and D2 may vary with process technology, the dimensions of the dielectric pattern and the semiconductor dies, which is not limited in the disclosure. In some embodiments, after disposing the semiconductor dies SD1 and SD3 within the first opening area 112a and the second opening area 114a, a first trench TR1 is formed between the semiconductor die SD1 and the conductive material 120 covering the inner sidewalls of the first wall structure 112. Similarly, a second trench TR2 is formed between the semiconductor die SD3 and the conductive material 120 covering the inner sidewalls of the second wall structure 112. In some embodiments, a width W1 of the first trench TR1 and a width W2 of the second trench TR2 may be in a range of about 50 um to about 500 um. The width W1 of the first trench TR1 and the width W2 of the second trench TR2 may be substantially equal or different. The widths W1 and W2 may be adjusted depending on the material or process technology of the subsequently formed insulting encapsulation.

Figure 5A:
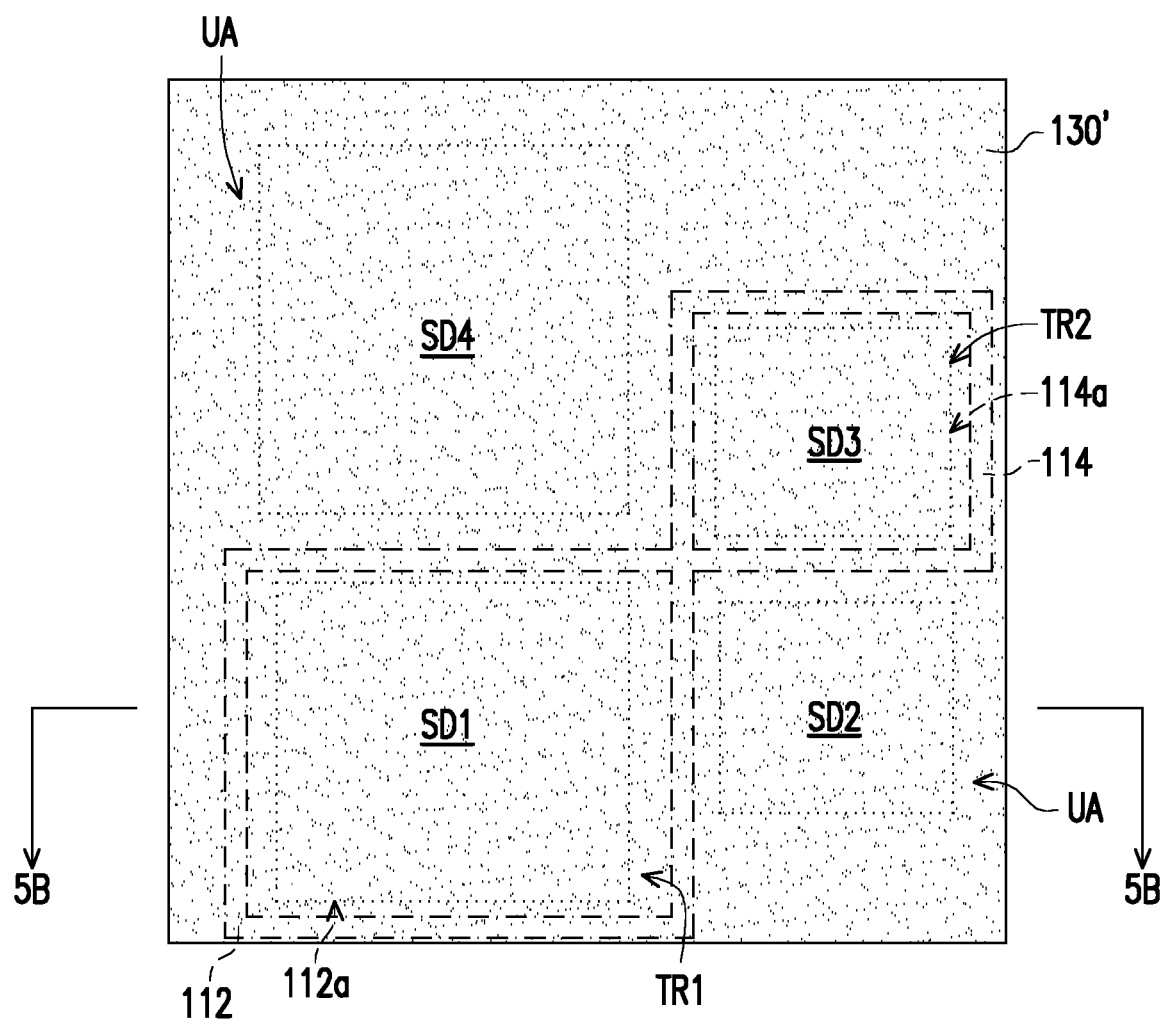
Figure 5B:
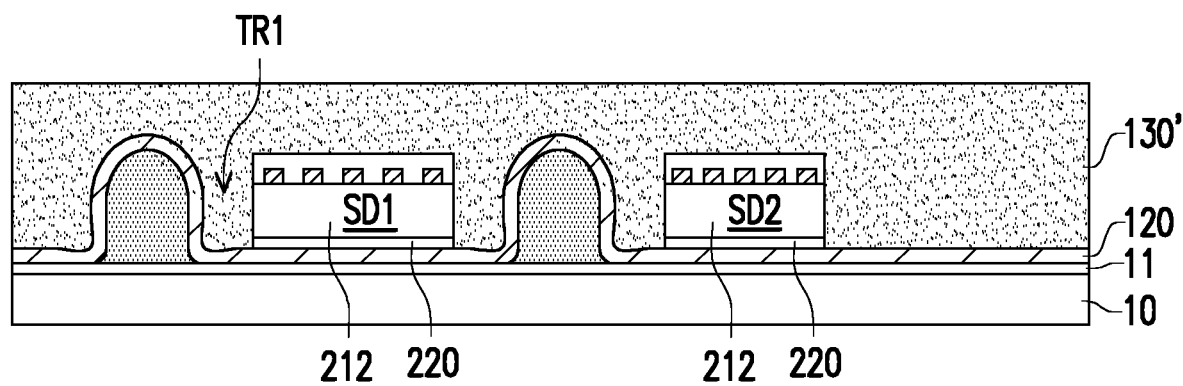
Figure 6A:
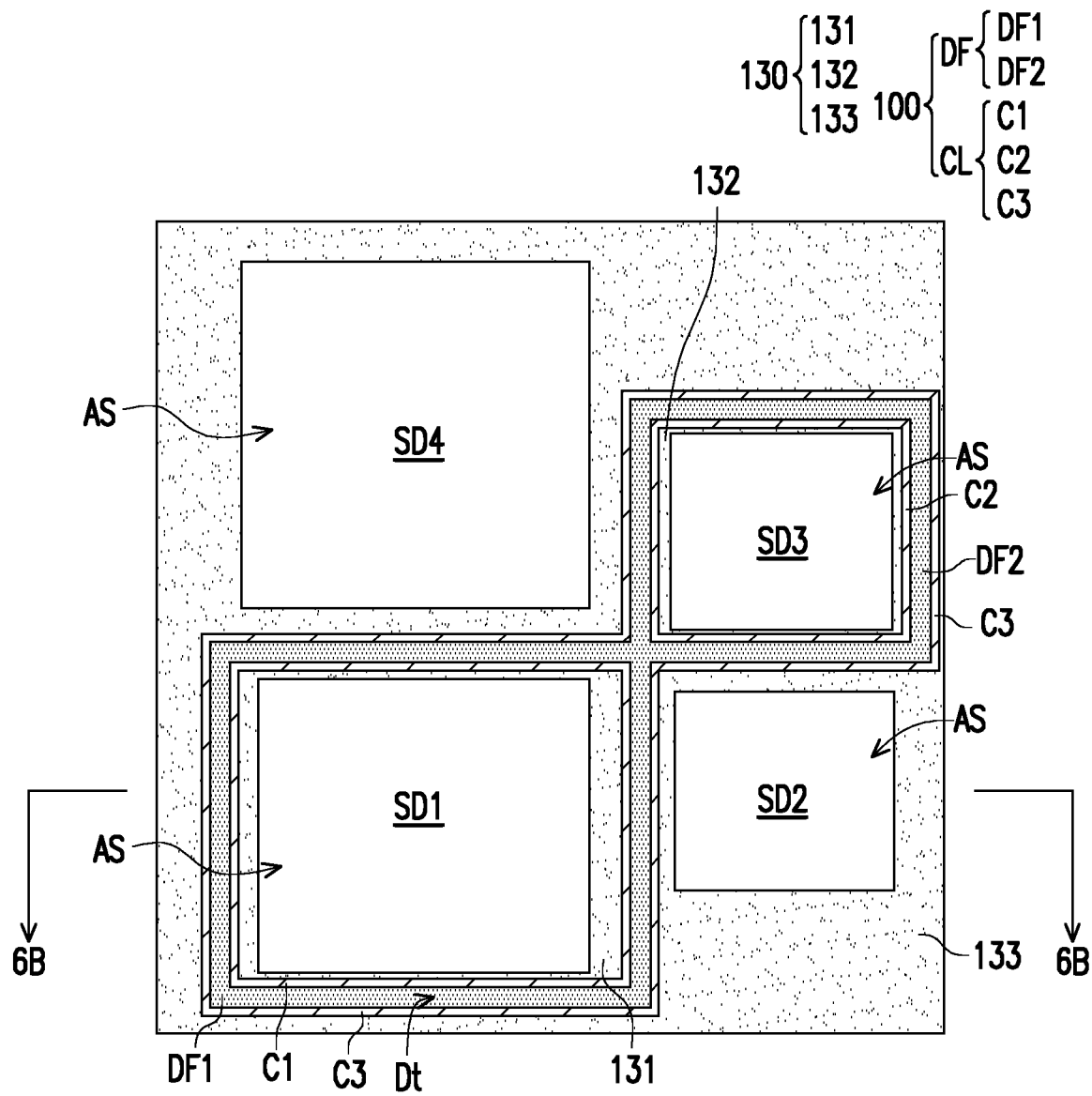
Figure 6B:
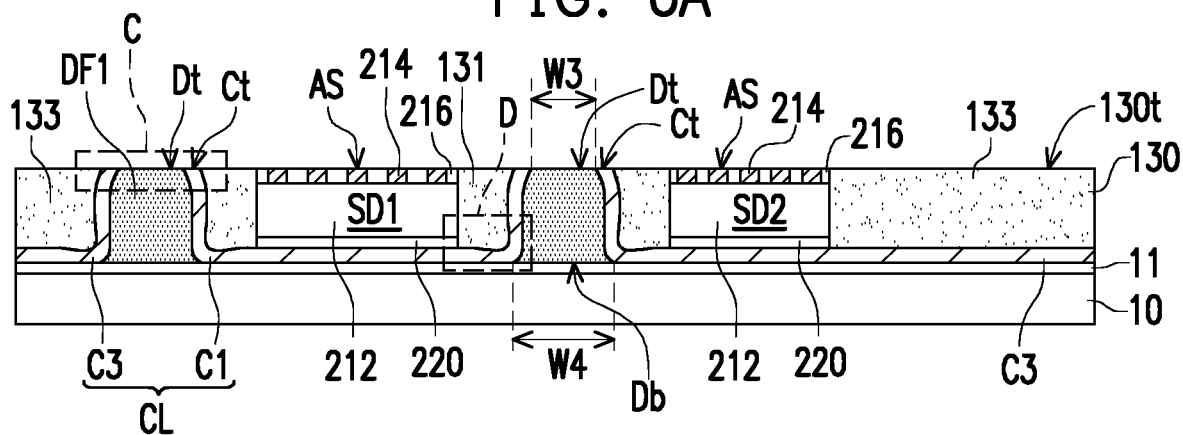

Referring to FIG. 5A and FIG. 5B, an insulting material 130' is formed on the conductive material 120 to encapsulate the semiconductor dies SD1, SD2, SD3, and SD4. It should be noted that as shown in FIG. 5A, the semiconductor dies SD1, SD2, SD3, and SD4 are illustrated by the dash lines to indicate they are covered by the insulting material 130' at this stage. The insulating material 130' may fill the first trench TR1 and the second trench TR2 to be in physical contact with the sidewalls of the semiconductor dies SD1 and SD3. The insulating material 130' may be formed in the unconfined area UA to at least cover the sidewalls of the semiconductor dies SD2 and SD4 which are disposed in the unconfined area UA. For example, the semiconductor dies SD1, SD2, SD3, and SD4 are over-molded by compression molding, transfer molding, or other suitable techniques. The insulating material 130' may include a low moisture absorption rate and may be rigid after solidification for protecting the semiconductor dies SD1, SD2, SD3, and SD4. For example, the insulating material 130' includes a molding compound (e.g., epoxy resins), a molding underfill, or other suitable electrically insulating materials. In some embodiments, the insulating material 130' includes a base material 134 (e.g., a polymer, a resin, an epoxy, etc.) and a plurality of filler particles 135 (e.g., dielectric particles of $SiO_2$, $Al_2O_3$, silica, etc.) distributed in the base material 134 as depicted in the enlarged views of FIG. 12 and FIG. 13.

Referring to FIG. 6A, FIG. 6B, FIG. 12, and FIG. 13, a planarization process is performed onto the insulating material 130', the dielectric pattern 110, and the conductive material 120 to respectively form an insulating encapsulation 130, a dielectric frame DF of an electromagnetic shielding compartment 100, and a conductive layer CL of the electromagnetic shielding compartment 100. The planarization process may include mechanical grinding, chemical mechanical polishing (CMP), etch back technique, or the like. The excess portions of the insulating material 130' over the semiconductor dies SD1, SD2, SD3, and SD4 are removed, and the respective semiconductor die SD1, SD2, SD3, and SD4 is at least laterally encapsulated by the insulating encapsulation 130 for protection.

In some embodiments, during the planarization process, the protection layer 216 and/or the conductive contacts 214 may be slightly grinded until the conductive contacts 214 are accessibly revealed for further electrical connection. The surface that the conductive contacts 214 are exposed may be referred to as an active surface AS of respective semiconductor die SD1, SD2, SD3, and SD4. It should be noted that the conductive contacts 214 of respective semiconductor die (e.g., SD1, SD2, SD3, and SD4) are omitted in the top view of FIG. 6A.

In some embodiments, during the planarization process, the first wall structure 112 and the second wall structure 114 of the dielectric pattern 110 are truncated or thinned to respectively form a first dam DF1 and a second dam DF2 of the dielectric frame DF. When the first wall structure 112 and the second wall structure 114 of the dielectric pattern 110 are truncated, a portion of the conductive material 120 covering the truncated part of the dielectric pattern 110 is also removed. For example, the rounded top 110T (e.g., shown in FIG. 10) of the dielectric pattern 110 and the conductive material 120 formed on the rounded top 110 are removed during the planarization process. In some embodiments, after performing the planarization process, a flat top surface Dt of the dielectric frame DF and a flat top surface Ct of the conductive layer CL are formed. After performing the planarization process, the top surface 130t of the insulating encapsulation 130, the top surface Dt of the dielectric frame DF, the top surface Ct of the conductive layer CL, and the active surface AS of the semiconductor dies (e.g., SD1, SD2, SD3, and SD4) are substantially leveled.

In some embodiments, the width (or diameter) W3 of the top surface Dt of the dielectric frame DF is less than the bottom width W4 of the bottom surface Db of the dielectric frame DF. A surface area of the top surface Dt of the dielectric frame DF may be less than a surface area of the bottom surface Db of the dielectric frame DF. In alternative embodiments in which the dielectric pattern has substantially vertical sidewalls without the footing bottom, the surface areas of the top surface and the bottom surface of the dielectric frame may be substantially equal. In some embodiments, the top portion of the dielectric frame DF may include sidewalls inclined toward each other, and the conductive layer CL following the profile of the dielectric frame DF may also include sidewalls inclined toward each other in a cross section as illustrated in FIG. 12.

In some embodiments, after performing the planarization process, some of the filler particles of the insulating material 130' may be partially removed as shown in FIG. 12. In certain embodiments in which the conductive material 120 includes the conductive fillers, after performing the planarization process, some of the conductive fillers may also be partially removed. After the planarization process, the insulating encapsulation 130 may include a plurality of discrete portions separated by the dielectric frame DF. For example, a first portion 131 of the insulating encapsulation 130 is disposed between the first dam DF1 and the semiconductor die SD1 to spatially separate the electromagnetic shielding compartment 100 and the semiconductor die SD1. A second portion 132 of the insulating encapsulation 130 may be disposed between the second dam DF2 and the semiconductor die SD2 to spatially separate the electromagnetic shielding compartment 100 and the semiconductor die SD2. The insulating encapsulation 130 may further include a third portion 133 disposed outside the electromagnetic shielding compartment 100 to surround the semiconductor dies SD3 and SD4. In some embodiments in which the dielectric frame DF includes the footing bottom, the bottom corners of the insulating encapsulation 130 may be rounded as shown in FIG. 13.

The conductive layer CL may include a first inner portion C1, a second inner portion C2, and a third outer portion C3. For example, the first inner portion C1 has two opposite sides which are respectively in physical contact with the inner sidewalls of the first dam DF1 and the first portion 131 of the insulating encapsulation 130. The first inner portion C1 may serve as an electromagnetic interference (EMI) shielding to the semiconductor dies shielded therein. The second inner portion C2 may have two opposite sides which are respectively in physical contact with the inner sidewalls of the second dam DF2 and the second portion 132 of the insulating encapsulation 130. The third outer portion C3 may be located between the third portion of the 133 of the insulating encapsulation 130 and the dielectric frame DF. For example, the first dam DF1 and the second dam DF2 of the dielectric frame DF may be formed in one-piece, and the third outer portion C3 is a continuous layer covering the outer sidewalls of the first dam DF1 and the second dam DF2. In some embodiments, a turning section TS of the first inner portion C1 (or the second inner portion C2) in physical contact with the bottom corner of the insulating encapsulation 130 and the footing bottom of the first dam DF1 may be thinner than other sections of the first inner portion C1 (or the second inner portion C2) as shown in FIG. 13.

Figure 7:
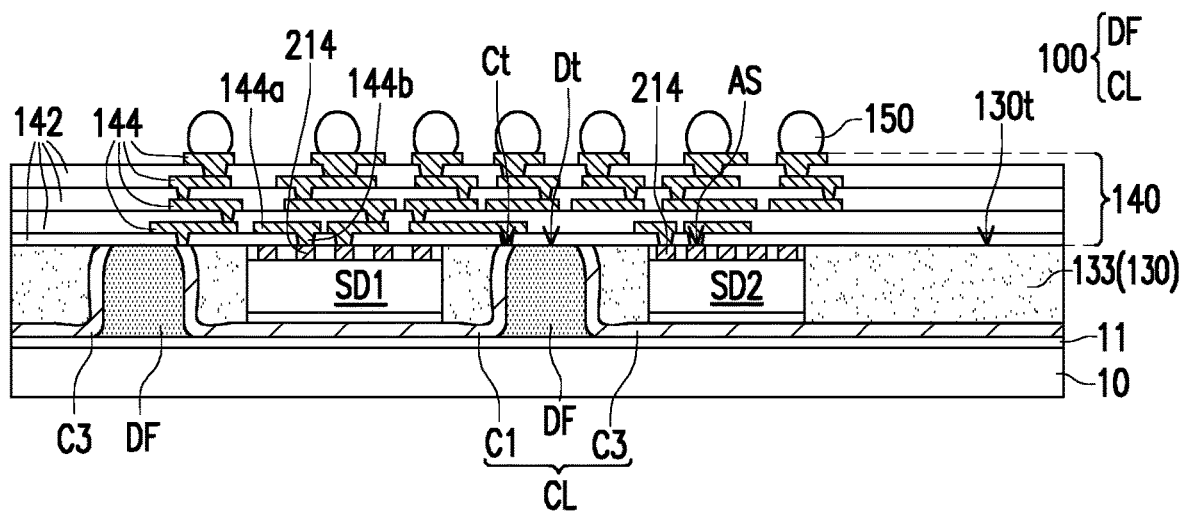

Referring to FIG. 7, a redistribution structure 140 is formed on the insulating encapsulation 130, the electromagnetic shielding compartment 100, and the semiconductor dies SD1, SD2, SD3, and SD4. The redistribution structure 140 may include a patterned dielectric layer 142 and a patterned conductive layer 144. The patterned conductive layer 144 may be referred to as a redistribution circuit layer and may include various conductive features (e.g., patterns, lines, vias, pads, etc.). For example, the patterned conductive layer 144 includes a conductive pattern 144a and a plurality of conductive vias 144b connected to the conductive pattern 144a. In some embodiments, the patterned conductive layer 144 of the redistribution structure 140 may provide signal, power, and ground connections to the semiconductor dies (e.g., SD1, SD2, SD3, and SD4). For example, a portion of the conductive vias 144b or conductive pattern 144a is electrically coupled to a ground contact (e.g., a contact configured to be connected to an electrical ground; not labeled).

In an exemplary embodiment, the manufacturing method of the redistribution structure 140 includes at least the following steps. The patterned dielectric layer 142 is formed on the top surface 130t of the insulating encapsulation 130, the top surface Dt of the dielectric frame DF, the top surface Ct of the conductive layer CL, and the active surface AS of the semiconductor dies (e.g., SD1, SD2, SD3, and SD4) using lithography and etching or other suitable deposition process. The patterned dielectric layer 142 may include a plurality of openings (not shown) exposing at least a portion of the conductive contacts 214 of the semiconductor dies (e.g., SD1, SD2, SD3, and SD4) and at least a portion of the top surface Ct of the conductive layer CL of the electromagnetic shielding compartment 100. Next, a conductive material is formed and patterned on the surface of the patterned dielectric layer 142 and inside the openings of the patterned dielectric layer 142 to form the patterned conductive layer 144. The conductive pattern 144a may be the portion of the patterned conductive layer 144 formed on the surface of the patterned dielectric layer 142, and the conductive vias 144b may be the portion of the patterned conductive layer 144 formed in the openings of the patterned dielectric layer 142. Some of the conductive vias 144b are in physical and electrical contact with the conductive contacts 214. Some other conductive vias 144b may be in physical and electrical contact with the first inner portion C1 (and the second inner portion C2; not shown) of the conductive layer CL. In some embodiments, the conductive vias 144b not electrically connected to the semiconductor dies (e.g., SD1, SD3) may be employed to ground an EMI shield. The third outer portion C3 of the conductive layer CL may be or may not be in electrical contact with the patterned conductive layer 144 of the redistribution structure 140. The abovementioned steps may be performed multiple times to obtain a multi-layered redistribution structure as required by the circuit design. In some embodiments, the topmost one of the patterned conductive layers 144 includes under-ball metallurgy (UBM) pattern for the subsequent ball-mounting process. Alternatively, the patterned conductive layer may be formed prior to the formation of the patterned dielectric layer. In addition, the numbers of the patterned dielectric layer and the patterned conductive layer may be selected based on demand, which are not limited in the disclosure.

Continue to FIG. 7, one or more conductive terminals 150 are formed on the topmost one of the patterned conductive layers 144. The conductive terminals 150 may be electrically coupled to the semiconductor dies SD1, SD2, SD3, and SD4 through the redistribution structure 140. In some embodiments, the conductive terminals 150 include conductive materials with low resistivity, such as Sn, Pb, Ag, Cu, Ni, Bi, or an alloy thereof. The conductive terminals 150 may be solder balls, ball grid array (BGA) balls, or other suitable conductive materials formed in other shapes. For example, the conductive terminals 150 are disposed on the UBM pattern of the patterned conductive layer 144 using a ball placement process and an optional reflow process. It should be noted that the number, the dimension, and the shape of the conductive terminals 150 are provided for illustrative purposes, which construe no limitation in the disclosure. In some embodiments, the ground contact of the semiconductor die (e.g., SD1) is coupled to the electrical ground (not shown) through one of the conductive terminals 150.

Figure 8:
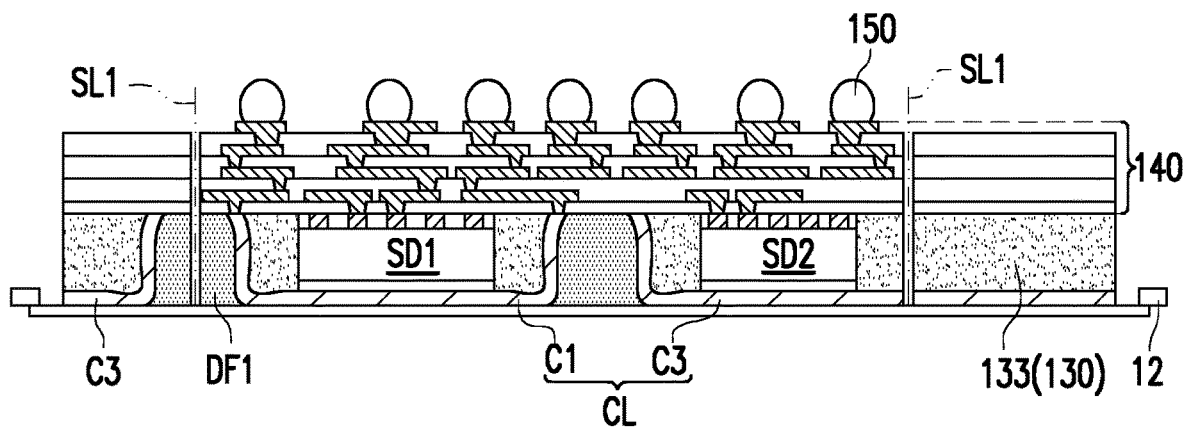
Figure 9:
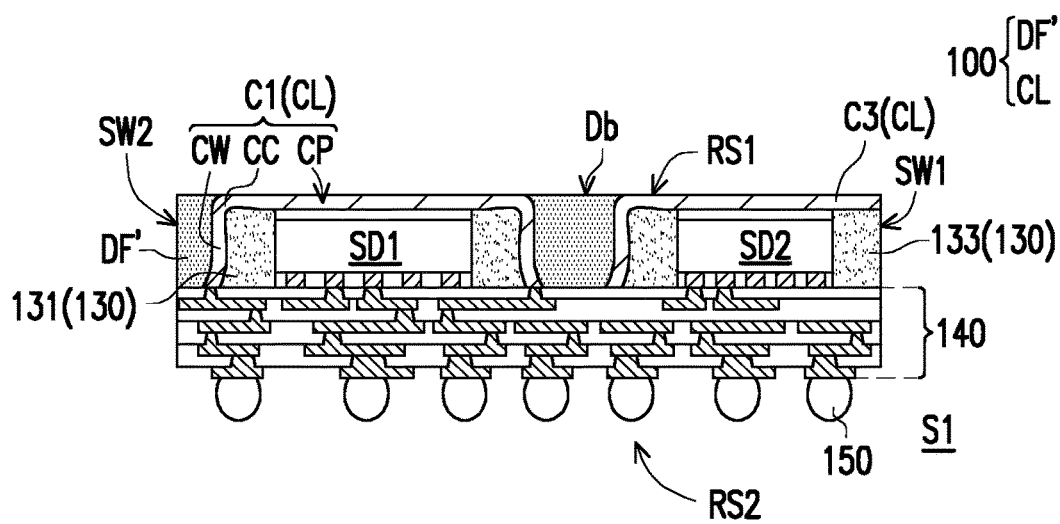

Referring to FIG. 8 and FIG. 9, after the conductive terminals 150 are formed, the temporary carrier 10 may be detached from the electromagnetic shielding compartment 100. In some embodiments in which the release layer 11 is a LTHC layer, suitable light illumination (e.g., UV light, UV laser irradiation, etc.) may be applied from the carrier side of the structure to weaken the bonds of the LTHC material such that the temporary carrier 10 may be separated from the remaining structure. Other techniques may be employed to remove the temporary carrier 10. In any case, any remaining adhesive of the release layer 11 may be cleaned from the electromagnetic shielding compartment 100. Subsequently, the remaining structure is placed on a dicing tape 12, and then a singulation process may be performed to form a plurality of semiconductor structures S1. For example, the remaining structure on the dicing tape 12 may be singulated along scribe lines SL1. The singulation process may use a mechanical sawing process, a laser cutting process, or the like. The singulating process may cut through the redistribution structure 140, the underlying third portion 133 of the insulating encapsulation 130, and the underlying third outer portion C3 of the conductive layer CL to form a substantially vertical sidewall SW1 of the semiconductor structure S1. In some embodiments, the singulating process cuts through the redistribution structure 140 and the underlying first dam DF1 (or second dam DF2) to form a substantially vertical sidewall SW2 of the semiconductor structure S1. The sidewalls SW1 and SW2 may be opposite to each other. The positions of the scribe lines SL1 may be adjusted depending on the process requirements and the variations will be described later in other embodiments.

In some embodiments, the semiconductor structure S1 includes the semiconductor dies (e.g., SD1, SD2, SD3, SD4, where SD3 and SD4 are not illustrated in the cross-sectional view of FIG. 9), the insulating encapsulation 130 laterally encapsulated each of the semiconductor dies SD1, SD2, SD3, and SD4, the electromagnetic shielding compartment 100 surrounding the insulating encapsulation 130 and shielding the semiconductor dies SD1, SD2, SD3, and SD4, the redistribution structure 140 disposed on the insulating encapsulation 130, the semiconductor dies SD1, SD2, SD3, and SD4, and the electromagnetic shielding compartment 100, and the conductive terminals 150 disposed on the redistribution structure 140. In some embodiments, the conductive terminals 150 are available to be mounted onto additional electrical component(s) (e.g., circuit carrier(s), system board(s), mother board(s), etc.). In some embodiments, grounding of the conductive layer CL of the electromagnetic shielding compartment 100 is provided by the patterned conductive layer 144 of the redistribution structure 140 and the conductive terminals 150 that may be coupled to local circuit ground of the additional electrical component(s).

The semiconductor structure S1 may include a first side RS1 and a second side RS2 opposite to each other. A cap section CP of the first inner portion C1 of the conductive layer CL of the electromagnetic shielding compartment 100 and the bottom surface Db of the singulated dielectric frame DF' are located at the first side RS1. In some embodiments, the cap section CP and bottom surface Db of the singulated dielectric frame DF' are substantially leveled or coplanar. The conductive terminals 150 may be distributed at the second side RS2. The rounded corners CC (or turning section) of the first inner portion C1 of the conductive layer CL may be adjacent to or may be connected to the cap section CP. The rounded corner CC may be thinner than the cap section CP. The profile of the rounded corners CC of the first inner portion C1 may be associated with the profile of the footing bottom of the singulated dielectric frame DF'. The curved sidewalls CW of the first inner portion C1 of the conductive layer CL may be adjacent to or may be connected to the rounded corners CC. The curved sidewalls CW of the first inner portion C1 may be interposed between the singulated dielectric frame DF' and the first portion 131 of the insulating encapsulation 130. In some embodiments, two curved sidewalls CW may be inclined opposite to each other, and the profile of the curved sidewalls CW is associated with the profile of the sidewalls of the dielectric frame DF. The third outer portion C3 of the conductive layer CL may cover the back surface of the semiconductor die SD2 and extend to interpose between the outer sidewall of the singulated dielectric frame DF' and the third portion 133 of the insulating encapsulation 130. In some embodiments, the first inner portion C1 of the conductive layer CL may be grounded to provide shielding from electromagnetic interference (EMI) for the semiconductor die (e.g., SD1). In some embodiments, the first inner portion C1 of the conductive layer CL may be provided for isolating the semiconductor die (e.g., SD1) from other components in a system in package (SiP) implementation, thereby preventing external interference and signal leakage and reducing electromagnetic susceptibility (EMS).

Figure 14A:
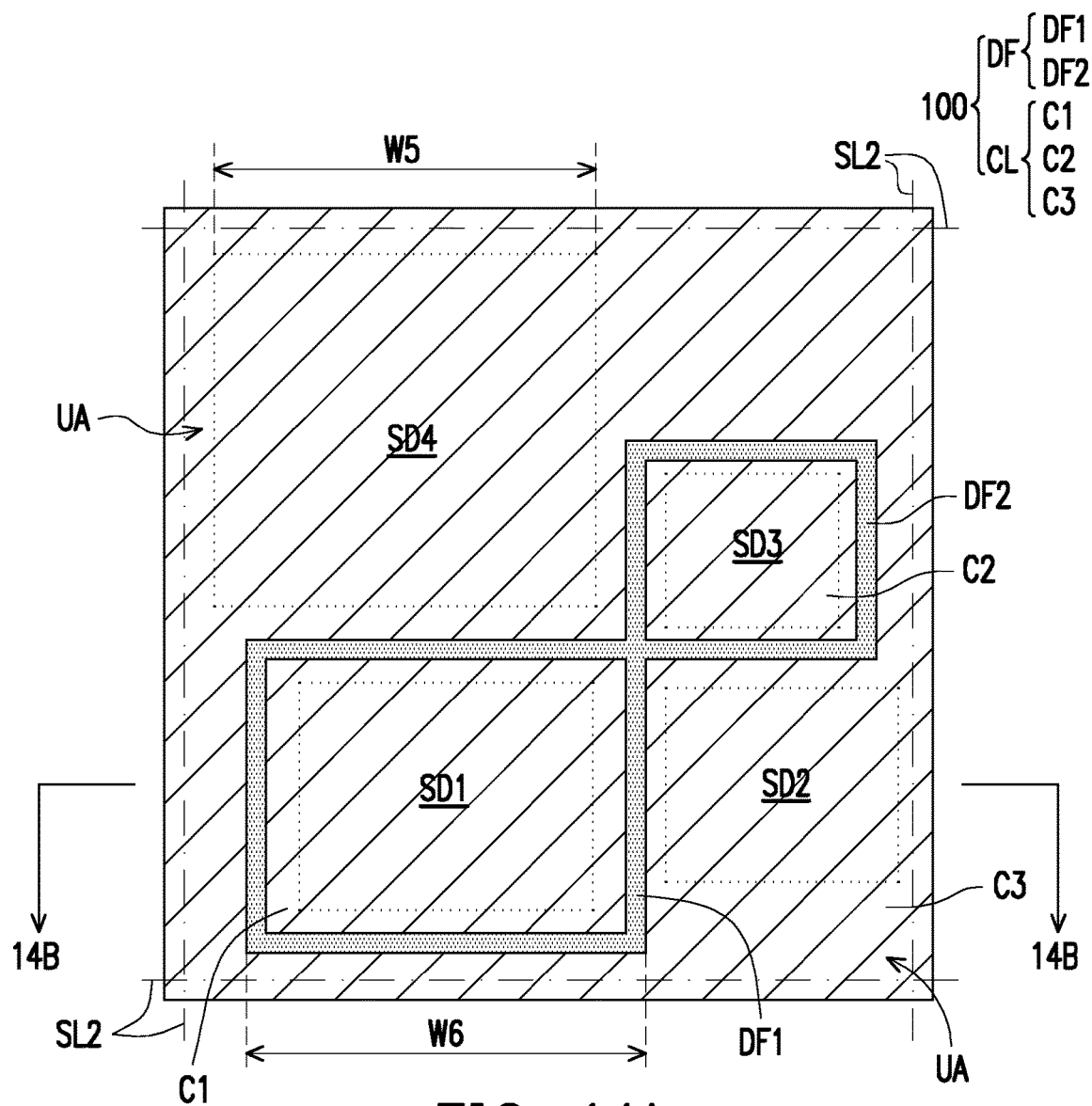
FIG. 14A is a schematic top plan view illustrating a semiconductor structure before performing a singulation process in accordance with some exemplary embodiments of the disclosure.
Figure 14B:
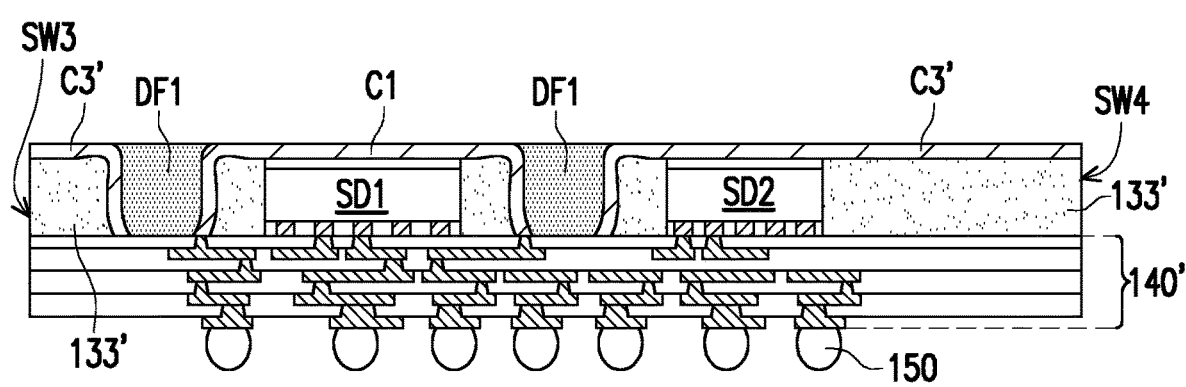
FIG. 14B is a schematic cross-sectional view of a semiconductor structure taken along section line 14B-14B of FIG. 14A after singulating along scribe lines, in accordance with some exemplary embodiments of the disclosure.

FIG. 14A is a schematic top plan view illustrating a semiconductor structure before performing a singulation process in accordance with some exemplary embodiments of the disclosure, and FIG. 14B is a schematic cross-sectional view of a semiconductor structure S2 taken along section line 14B-14B of FIG. 14A after singulating along scribe lines SL2, in accordance with some exemplary embodiments of the disclosure. The manufacturing method of the semiconductor structure S2 is similar to that of the semiconductor structure S1, and the detailed descriptions are omitted for brevity. Like elements in throughout the drawings are designated with the same reference numbers for ease of understanding and the details thereof are not repeated herein. Referring to FIG. 14A and FIG. 14B, the semiconductor dies SD1 and SD3 enclosed by the first dam DF1 and the second dam DF2 may be shielded by the first inner portion C1 and the second inner portion C2, respectively. One of the semiconductor dies (e.g., SD4 or SD2) disposed within the unconfined area UA may has a dimension greater than the adjacent ones of the semiconductor dies (e.g., SD1 and/or SD3) disposed within the electromagnetic shielding compartment 100. For example, the semiconductor die SD4 has a width W5 greater than a width W6 of the closest one side of the electromagnetic shielding compartment 100 (i.e. the side of the first dam DF1.). The semiconductor die SD2 in the unconfined area UA may have a width greater than a width of the closest one side of the second dam DF2. In such embodiments, the scribe lines SL2 are positioned beyond the boundary of the semiconductor dies SD2 and SD4 located in the unconfined area UA to avoid damage to the semiconductor dies SD2 and SD4, and the dielectric frame DF of the electromagnetic shielding compartment 100 may remain substantially intact. The first inner portion C1 and the second inner portion C2 may prevent or reduce the electromagnetic inference generated by the semiconductor dies SD1 and SD3 from interfering with other semiconductor dies SD2 and SD4 in the system. After performing the singulation process along the scribe lines SL2, the semiconductor structure S2 is formed as shown in FIG. 14B.

In some embodiments, the singulating process cuts through the redistribution structure, the underlying third portion of the insulating encapsulation, and the underlying third outer portion of the conductive layer to form substantially vertical sidewalls SW3 and SW4 of the semiconductor structure S2. For example, the singulated third portion of the insulating encapsulation 133' may have an outer sidewall substantially aligned with the outer sidewalls of the singulated redistribution structure 140' and the singulated third outer portion C3' of the conductive layer CL. The electromagnetic shielding compartment 100 including the dielectric frame DF and the conductive layer CL are laterally encapsulated by the singulated third portion of the insulating encapsulation 133'. The top surface singulated third portion of the insulating encapsulation 133' opposite to the singulated redistribution structure 140' may be covered by the singulated third outer portion C3' of the conductive layer CL.

Figure 15A:
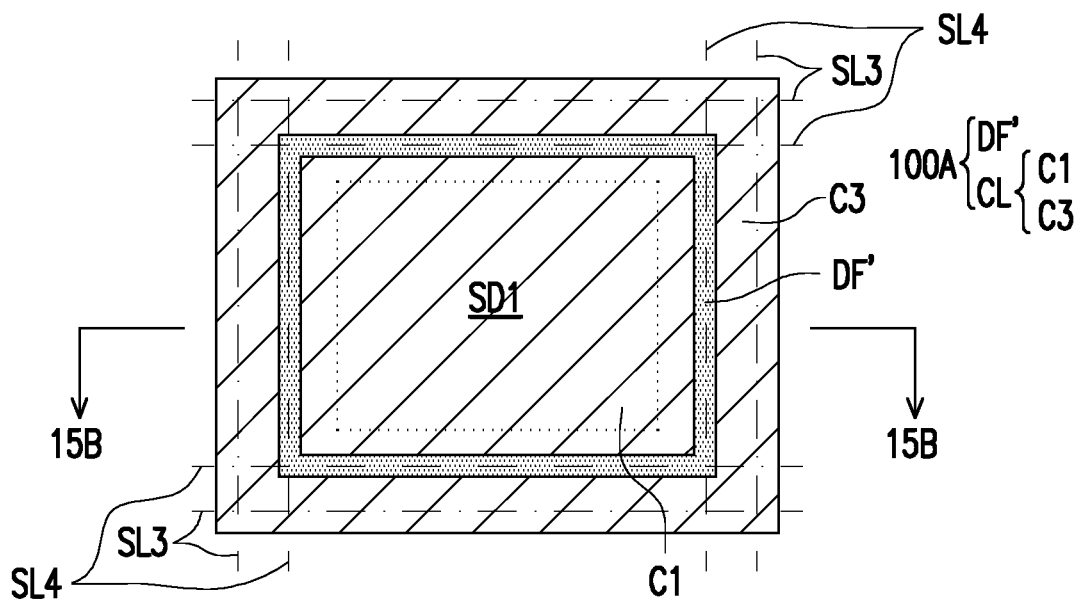
FIG. 15A is a schematic top plan view illustrating a semiconductor structure before performing a singulation process in accordance with some exemplary embodiments of the disclosure.
Figure 15B:
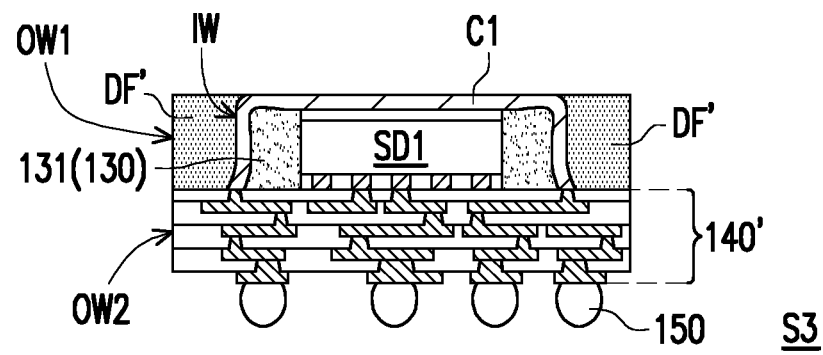
FIG. 15B is a schematic cross-sectional view of a semiconductor structure taken along section line 15B-15B of FIG. 15A after singulating along scribe lines, in accordance with some exemplary embodiments of the disclosure.
Figure 15C:
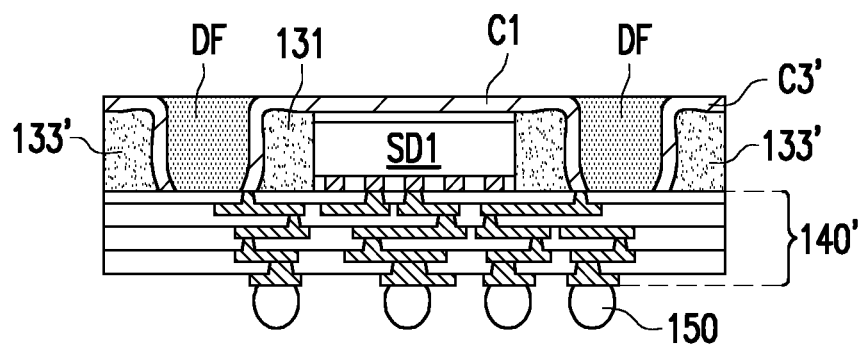
FIG. 15C is a schematic cross-sectional view of a semiconductor structure taken along section line 15B-15B of FIG. 15A after singulating along scribe lines, in accordance with some exemplary embodiments of the disclosure.

FIG. 15A is a schematic top plan view illustrating a semiconductor structure before performing a singulation process in accordance with some exemplary embodiments of the disclosure, FIG. 15B is a schematic cross-sectional view of a semiconductor structure S3 taken along section line 15B-15B of FIG. 15A after singulating along scribe lines SL3, in accordance with some exemplary embodiments of the disclosure, and FIG. 15C is a schematic cross-sectional view of a semiconductor structure S4 taken along section line 15B-15B of FIG. 15A after singulating along scribe lines SL4, in accordance with some exemplary embodiments of the disclosure. The manufacturing method of the semiconductor structures S3 and S4 is similar to that of the semiconductor structure S1, and the detailed descriptions are omitted for brevity. Like elements in throughout the drawings are designated with the same reference numbers for ease of understanding and the details thereof are not repeated herein.

Referring to FIG. 15A and FIG. 15B, the semiconductor die SD1 is laterally encapsulated by the first portion 131 of the insulating encapsulation and shielded by the electromagnetic shielding structure 100A. The electromagnetic shielding structure 100A form an electromagnetically shield around the semiconductor die SD1 to prevent or reduce electromagnetic interference or electromagnetic susceptibility. The first inner portion C1 of the conductive layer CL of the electromagnetic shielding structure 100A may surround the first portion 131 of the insulating encapsulation 130 and extend to cover the back side of the semiconductor die SD1. The dielectric frame DF' of the electromagnetic shielding structure 100A may be a single frame and laterally cover the first inner portion C1 of the conductive layer CL. It should be noted that although only one semiconductor die is illustrated, multiple semiconductor dies and electromagnetic shielding structures may be disposed in an array, and a singulation process is performed to form a plurality of semiconductor structures S3. In other embodiments, a plurality of dielectric frames DF' may be formed as a grid, and one of the dielectric frames DF' may have sidewalls sharing with the adjacent ones of the dielectric frames DF'.

In some embodiments, the scribe lines SL3 is positioned at the dielectric frame DF' of the electromagnetic shielding structure 100A. After performing the singulation process along the scribe lines SL3, the semiconductor structure S3 is formed as shown in FIG. 15B. In some embodiments, the singulating process cuts through the redistribution structure and the underlying dielectric frames DF' to form substantially vertical sidewalls of the semiconductor structure S3. For example, the singulated dielectric frames DF' may have the outer sidewalls OW1 substantially aligned with the outer sidewalls OW2 of the singulated redistribution structure 140'. The inner sidewalls IW of the singulated dielectric frames DF' opposite to the outer sidewalls OW1 may be in physical contact with the first inner portion C1 of the conductive layer CL.

Referring to FIG. 15A and FIG. 15C, the semiconductor structure S4 is formed by singulating along the scribe lines SL4. The scribe lines SL4 may be positioned beyond the boundary of the dielectric frame DF', so the dielectric frame DF' may remain intact after the singulation process. For example, the singulating process cuts through the redistribution structure, the underlying third portion of the insulating encapsulation, and the underlying third outer portion of the conductive layer to form substantially vertical sidewalls of the semiconductor structure S4. For example, the singulated third portion of the insulating encapsulation 133' may have the outer sidewalls substantially aligned with the outer sidewalls of the singulated redistribution structure 140' and the singulated third outer portion C3' of the conductive layer CL. It should be noted that the positions of the scribe lines SL4 may be vary depending on the process equipment. For example, the scribe lines SL4 may be close to the sidewalls of the third outer portion of the conductive layer CL or may be positioned between the sidewalls of the third outer portion of the conductive layer CL and the dielectric frame DF. In such embodiments, the third portion of the insulating encapsulation may not be present in the semiconductor structure.

According to some embodiments, a semiconductor structure includes a first semiconductor die, an insulating encapsulation laterally encapsulating the first semiconductor die, an electromagnetic shielding structure enclosing the first semiconductor die and a first portion of the insulating encapsulation, and a redistribution structure. The electromagnetic shielding structure includes a first conductive layer and a dielectric frame laterally covering the first conductive layer. The first conductive layer surrounds the first portion of the insulating encapsulation and extends to cover a first side of the first semiconductor die. The dielectric frame includes a first surface substantially leveled with the first conductive layer. The redistribution structure is disposed on a second side of the first semiconductor die opposing to the first side, and the redistribution structure is electrically coupled to the first semiconductor die and the first conductive layer of the electromagnetic shielding structure.

According to some alternative embodiments, a semiconductor structure includes semiconductor dies separately disposed from one another, an insulating encapsulation laterally covering each of the semiconductor dies, and an electromagnetic shielding compartment. At least one of the semiconductor dies and a portion of the insulating encapsulation are disposed within the electromagnetic shielding compartment. The electromagnetic shielding compartment includes a first dielectric frame and a first conductive layer. The first conductive layer is disposed along an inner sidewall of the first dielectric frame and extends to shield the at least one of the semiconductor dies disposed within the first dielectric frame. A turning section of the first conductive layer located at a corner of the insulating encapsulation is thinner than a cap section of the first conductive layer located on the at least one of the semiconductor dies.

According to some alternative embodiments, a manufacturing method of a semiconductor structure includes at least the following steps. A conductive material is formed along an outer surface of a dielectric pattern and extends within an area enclosed by the dielectric pattern. A first semiconductor die is disposed on the conductive material in the area enclosed by the dielectric pattern. An insulating material is formed on the conductive material at least in the area enclosed by the dielectric pattern to cover the first semiconductor die. The insulating material, the dielectric pattern, and the conductive material are leveled to respectively form an insulating encapsulation, a dielectric frame of an electromagnetic shielding compartment, and a conductive layer of the electromagnetic shielding compartment. An active surface of the first semiconductor die is accessibly revealed by the insulating encapsulation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a first semiconductor die;
an insulating encapsulation laterally encapsulating the first semiconductor die;
an electromagnetic shielding structure enclosing the first semiconductor die and a first portion of the insulating encapsulation, the electromagnetic shielding structure comprising:
a first conductive layer surrounding the first portion of the insulating encapsulation and extending to cover a first side of the first semiconductor die; and
a dielectric frame laterally covering the first conductive layer and comprising a first surface substantially leveled with the first conductive layer; and
a redistribution structure disposed on a second side of the first semiconductor die opposing to the first side, and the redistribution structure electrically coupled to the first semiconductor die and the first conductive layer of the electromagnetic shielding structure.

2. The semiconductor structure of claim 1, wherein the dielectric frame of the electromagnetic shielding structure further comprises a second surface opposite to the first surface and facing the redistribution structure, and a surface area of the second surface is less than that of the first surface.

3. The semiconductor structure of claim 1, wherein the first conductive layer of the electromagnetic shielding structure comprises:
a cap section covering the first side of the first semiconductor die and the portion of the insulating encapsulation, and
a rounded corner adjacent to the cap section and comprising a thickness less than a thickness of the cap section.

4. The semiconductor structure of claim 1, wherein the dielectric frame of the electromagnetic shielding structure comprises:
an inner sidewall in contact with the first conductive layer, and
an outer sidewall opposite to the inner sidewall and substantially leveled with a sidewall of the redistribution structure.

5. The semiconductor structure of claim 1, further comprising:
a second semiconductor die disposed aside the first semiconductor die, laterally encapsulated by a second portion of the insulating encapsulation, and electrically coupled to the redistribution structure, wherein the dielectric frame of the electromagnetic shielding structure is interposed between the first semiconductor die and the second semiconductor die.

6. The semiconductor structure of claim 5, wherein the electromagnetic shielding structure further comprising:
a second conductive layer surrounding the second portion of the insulating encapsulation and extending to cover the second semiconductor die, wherein the dielectric frame is interposed between the first conductive layer and the second conductive layer.

7. A semiconductor structure, comprising:
semiconductor dies separately disposed from one another;
an insulating encapsulation laterally covering each of the semiconductor dies; and
an electromagnetic shielding compartment, at least one of the semiconductor dies and a portion of the insulating encapsulation disposed within the electromagnetic shielding compartment, the electromagnetic shielding compartment comprising:

a first dielectric frame; and a first conductive layer disposed along an inner sidewall of the first dielectric frame and extending to shield the at least one of the semiconductor dies disposed within the first dielectric frame, wherein a turning section of the first conductive layer located at a corner of the insulating encapsulation is thinner than a cap section of the first conductive layer located on the at least one of the semiconductor dies.

8. The semiconductor structure of claim 7, wherein the first dielectric frame comprises a first surface substantially leveled with the cap section of the first conductive layer.

9. The semiconductor structure of claim 8, wherein the first dielectric frame further comprises a second surface opposite to the first surface and substantially leveled with the insulating encapsulation.

10. The semiconductor structure of claim 7, further comprising:

a redistribution structure disposed on the semiconductor dies, the insulating encapsulation, and the electromagnetic shielding compartment, and electrically coupled to the semiconductor dies and the first conductive layer of the electromagnetic shielding compartment.

11. The semiconductor structure of claim 7, wherein the electromagnetic shielding compartment further comprises:

a second dielectric frame in contact with at least an edge of the first dielectric frame, wherein another one of the semiconductor dies and another portion of the insulating encapsulation are disposed within the second dielectric frame; and a second conductive layer disposed between an inner sidewall of the second dielectric frame and a sidewall of the another portion of the insulating encapsulation, and extending to shield the another one of the semiconductor dies and the another portion of the insulating encapsulation.

12. The semiconductor structure of claim 11, wherein an outer sidewall of the second dielectric frame of the electromagnetic shielding compartment is partially in contact with an outer sidewall of the first dielectric frame of the electromagnetic shielding compartment.

13. The semiconductor structure of claim 11, wherein the electromagnetic shielding compartment further comprises:

a third conductive layer disposed along outer sidewalls of the first dielectric frame and the second dielectric frame and extending to cover the semiconductor dies unconfined by the electromagnetic shielding compartment.

* * * * *